(12) United States Patent
Wang et al.

(10) Patent No.: US 11,216,117 B2
(45) Date of Patent: Jan. 4, 2022

(54) FINGERPRINT IDENTIFICATION DEVICE, ARRAY SUBSTRATE, DISPLAY DEVICE AND FINGERPRINT IDENTIFICATION METHOD

(71) Applicant: BOE TECHNOLOGY GROUP CO., LTD., Beijing (CN)

(72) Inventors: Pengpeng Wang, Beijing (CN); Xue Dong, Beijing (CN); Haisheng Wang, Beijing (CN); Xiaoliang Ding, Beijing (CN); Yingming Liu, Beijing (CN); Chih Jen Cheng, Beijing (CN); Wei Liu, Beijing (CN); Xueyou Cao, Beijing (CN); Ping Zhang, Beijing (CN); Changfeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 534 days.

(21) Appl. No.: 16/318,281

(22) PCT Filed: May 25, 2018

(86) PCT No.: PCT/CN2018/088366
§ 371 (c)(1),
(2) Date: Jan. 16, 2019

(87) PCT Pub. No.: WO2019/029229
PCT Pub. Date: Feb. 14, 2019

(65) Prior Publication Data
US 2021/0333925 A1 Oct. 28, 2021

(30) Foreign Application Priority Data
Aug. 10, 2017 (CN) .......................... 201710680606.8

(51) Int. Cl.
*G06F 3/038* (2013.01)
*G06F 3/042* (2006.01)
(Continued)

(52) U.S. Cl.
CPC .......... *G06F 3/0421* (2013.01); *G06F 3/0412* (2013.01); *G06K 9/0004* (2013.01); *H01L 27/124* (2013.01); *G06F 2203/04105* (2013.01)

(58) Field of Classification Search
CPC ................ G06F 3/0412; G06F 3/0421; G06F 2203/04105; G06K 9/0004; H01L 27/124; H01L 27/127; H01L 29/786
See application file for complete search history.

(56) References Cited

U.S. PATENT DOCUMENTS 5,864,296 A * 1/1999 Upton .................. G06K 9/0002
340/5.53
2013/0214801 A1 8/2013 Hsiao
(Continued)

FOREIGN PATENT DOCUMENTS

CN 104155785 A 11/2014
CN 104347527 A 2/2015
(Continued)

OTHER PUBLICATIONS

Extended European Search Report in European Patent Application No. 18833144.1 dated Mar. 26, 2021.
(Continued)

*Primary Examiner* — Joe H Cheng
(74) *Attorney, Agent, or Firm* — Collard & Roe, P.C.

(57) ABSTRACT

Embodiments of the present disclosure provide a fingerprint identification device, an array substrate, a display device and a fingerprint identification method. The fingerprint identification device includes: a first gate line, a second gate line, a read signal line and a voltage dividing unit, wherein, a plurality of fingerprint identification units are defined by the second gate line and the read signal line intersecting with each other, and the fingerprint identification unit includes a photosensitive member and a thin film transistor; the first gate line is connected with the voltage dividing unit, the
(Continued)

voltage dividing unit includes a pressure sensitive member and an equivalent resistor connected in series, and the second gate line is connected between the pressure sensitive member and the equivalent resistor.

20 Claims, 4 Drawing Sheets

(51) Int. Cl.
    *G06F 3/041*           (2006.01)
    *G06K 9/00*            (2006.01)
    *H01L 27/12*           (2006.01)

(56) References Cited

U.S. PATENT DOCUMENTS

| | | |
|---|---|---|
| 2014/0354597 A1 | 12/2014 | Kitchens, II et al. |
| 2016/0042216 A1 | 2/2016 | Yang et al. |
| 2017/0193266 A1* | 7/2017 | Ye .................... G01R 27/2605 |
| 2018/0150668 A1 | 5/2018 | Li et al. |
| 2019/0027499 A1* | 1/2019 | Li ........................ H01L 31/105 |

FOREIGN PATENT DOCUMENTS

| | | |
|---|---|---|
| CN | 105550662 A | 5/2016 |
| CN | 107463911 A | 12/2017 |
| EP | 2416214 A1 | 2/2012 |
| WO | 2012166429 A2 | 12/2012 |

OTHER PUBLICATIONS

International Search Report of PCT/CN2018/088366 in Chinese, dated Aug. 8, 2018, with English translation.
Notice of Transmittal of the International Search Report of PCT/CN2018/088366 in Chinese, dated Aug. 8, 2018.
Written Opinion of the International Searching Authority of PCT/CN2018/088366 in Chinese, dated Aug. 8, 2018 with English translation.

* cited by examiner

FINGERPRINT IDENTIFICATION DEVICE, ARRAY SUBSTRATE, DISPLAY DEVICE AND FINGERPRINT IDENTIFICATION METHOD

CROSS REFERENCE TO RELATED APPLICATIONS

This application is the National Stage of PCT/CN2018/088366 filed on May 25, 2018, which claims priority under 35 U.S.C. § 119 of Chinese Application No. 201710680606.8 filed on Aug. 10, 2017, the disclosure of which is incorporated by reference.

TECHNICAL FIELD

The present disclosure relates to a fingerprint identification device, an array substrate, a display device and a fingerprint identification method.

BACKGROUND

In recent years, with rapid development of technologies, mobile products with biometric identification functions have gradually entered people's lives and work; and a fingerprint technology has attracted much attention because of its unique identity. Pressing and sliding fingerprint identification technologies based on a silicon-based process have been integrated into mobile products, and a core of future attention is a fingerprint identification technology in a display region.

Due to presence of light in environment, when fingerprint identification is performed with an existing optical fingerprint identification device, a lot of interferences and noises of light will be formed, which makes it difficult to extract a weak fingerprint valley-ridge signal from complex ambient light, resulting in increased difficulty in fingerprint identification.

SUMMARY

Embodiments of the present disclosure provide a fingerprint identification device, an array substrate, a display device and a fingerprint identification method, to solve the problem of increased difficulty in fingerprint identification of a current optical fingerprint identification device.

At one aspect, an embodiment of the present disclosure provides a fingerprint identification device, comprising: a first gate line, a second gate line, a read signal line and a voltage dividing unit, wherein, a plurality of fingerprint identification units are defined by the second gate line and the read signal line intersecting with each other, and the fingerprint identification unit includes a photosensitive member and a thin film transistor; the first gate line is connected with the voltage dividing unit, the voltage dividing unit includes a pressure sensitive member and an equivalent resistor connected in series, and the second gate line is connected between the pressure sensitive member and the equivalent resistor.

For example, under a condition that the pressure sensitive member is not pressed, the thin film transistor is in an OFF state.

For example, one end of the voltage dividing unit is connected with the first gate line, and the other end of the voltage dividing unit is grounded.

For example, in a case where the thin film transistor is an N-type thin film transistor, when the pressure sensitive member is not pressed, a gate electrode voltage of the thin film transistor is smaller than a critical ON voltage.

For example, in a case where the thin film transistor is a P-type thin film transistor, when the pressure sensitive member is not pressed, a gate electrode voltage of the thin film transistor is larger than a critical ON voltage.

For example, the second gate line is a whole row of continuous gate line, and the pressure sensitive member is used for controlling the thin film transistor connected with the second gate line.

For example, the second gate line includes a plurality of gate lines independent of one another, and the pressure sensitive member is used for correspondingly controlling a thin film transistor connected with a segment of second gate line.

For example, the pressure sensitive member includes an upper electrode layer, a pressure sensitive material and a lower electrode layer arranged in a stacked manner, the upper electrode layer is shared with a first electrode layer of the photosensitive member, and the lower electrode layer is shared with a second electrode layer of the photosensitive member.

For example, the pressure sensitive material is polyvinylidene fluoride or a quantum channel synthetic material.

For example, under a condition that piezoresistance of the pressure sensitive member becomes smaller as pressure increases, the first gate line is connected with one end of the pressure sensitive member in the voltage dividing unit.

For example, under a condition that piezoresistance of the pressure sensitive member becomes larger as pressure increases, the first gate line is connected with one end of the equivalent resistor in the voltage dividing unit.

For example, under a condition that piezoresistance of the pressure sensitive member becomes smaller as pressure increases, the first gate line is connected with one end of the pressure sensitive member in the voltage dividing unit; and under a condition that the piezoresistance of the pressure sensitive member becomes smaller as the pressure increases, the first gate line is connected with one end of the equivalent resistor in the voltage dividing unit.

For example, a gate electrode of the thin film transistor is connected with the second gate line, a first electrode of the thin film transistor is connected with the photosensitive member, and a second electrode of the thin film transistor is connected with the read signal line.

At another aspect, the present disclosure provides an array substrate, comprising the fingerprint identification device as mentioned above.

At still another aspect, the present disclosure provides a display device, comprising a light-emitting unit, a light guide plate, a small orifice plate and the array substrate as mentioned above, wherein, the small orifice plate is located between the light guide plate and the array substrate.

For example, the pressure sensitive member is located outside an effective fingerprint identification region; and the effective fingerprint identification region is an image region generated on the array substrate after the fingerprint optical signal passes through a small orifice on the small orifice plate.

For example, a distance from the light guide plate to the small orifice plate is larger than a distance from the small orifice plate to the array substrate.

At still another aspect, the present disclosure provides a fingerprint identification method, in which the fingerprint identification device as mentioned above is used, comprising: acquiring, by the read signal line, a fingerprint signal of a finger, when the pressure sensitive member is pressed by the finger, to perform fingerprint identification.

For example, the fingerprint identification method further comprises: obtaining different fingerprint signal amounts according to a turning on degree of the thin film transistor, when the pressure sensitive member is pressed, comparing the fingerprint signal amount with a reference signal amount, to obtain information of a pressing pressure; and triggering different applications according to the information of the pressing pressure.

For example, the fingerprint identification method further comprises obtaining the reference signal amount, wherein, the reference signal amount is obtained from pre-stored fingerprint picture information.

BRIEF DESCRIPTION OF THE DRAWINGS

In order to make objects, technical details and advantages of the embodiments of the invention apparent, the technical solutions of the embodiment will be described in a clearly and fully understandable way in connection with the drawings related to the embodiments of the invention.

DETAILED DESCRIPTION

Figure 1:
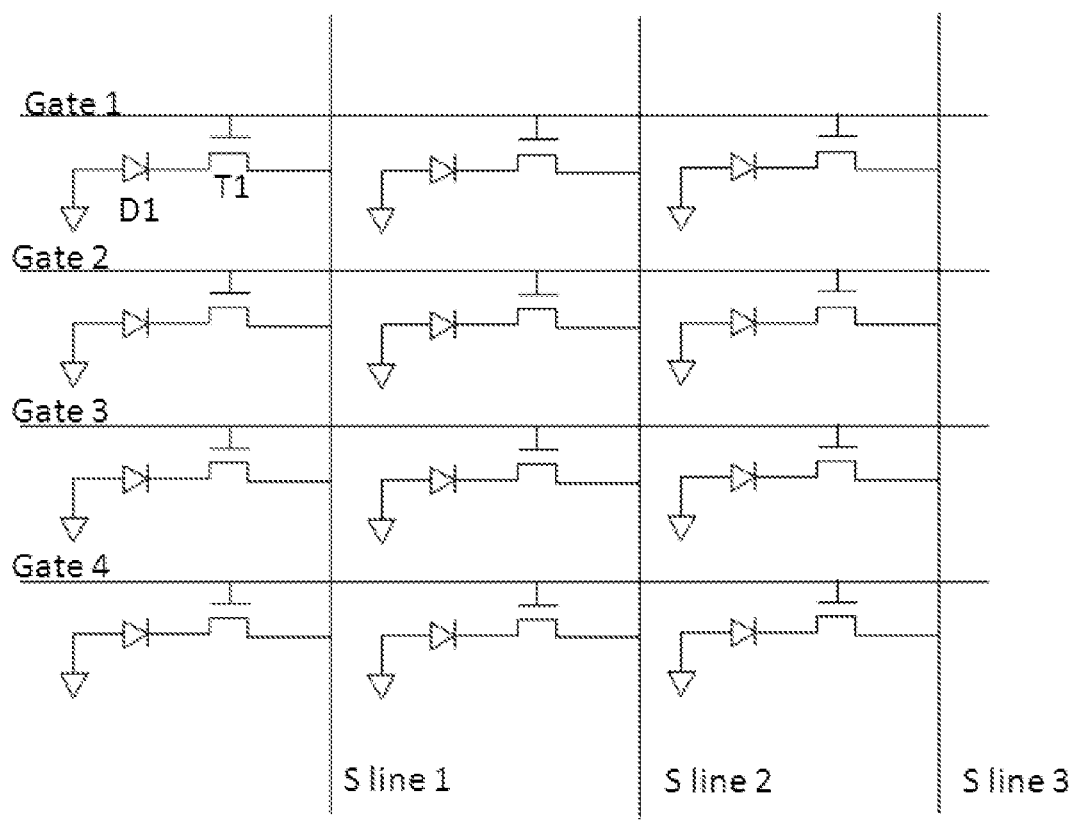
FIG. 1 shows a circuit structural diagram of an optical fingerprint identification device.

Embodiments of the present disclosure will be in detail described hereinafter, and examples of the embodiments are shown in the drawings, in which the same or similar reference number is denoted as the same or similar members or the members with the same or similar function throughout. The described embodiments in conjunction with the accompanying drawings of the present disclosure are exemplary, only is used to explain the present disclosure and do not intend to limit the present disclosure.

In the description, the description with referring to the terms "an embodiment", "some embodiments", "example", "specific example" or "some examples" means that the specific feature, structure, material or character described with connection with the embodiment or example is included in at least one embodiment or example of the present disclosure. In the description, the schematic description of the above terms is not necessary to direct to the same embodiment or example. The described feature, structure, material or character may be combined in any suitable manner in any or a plurality of embodiments or examples. Further, in case of no conflict, different embodiments or examples and features in different embodiments or example described in the specification can be combined.

Further, the terms, such as "first," "second," or the like, which are used in the description and the claims of the present disclosure, are not intended to indicate or imply the relative importance or implicitly indicate the amount of the features. Thus, the features defined by "first," "second," may explicitly indicate or implicitly includes at least one feature. In the description of the present disclosure, Unless otherwise defined, "a plurality of" means two or more.

In order to make objects, technical details and advantages of the embodiments of the invention apparent, the technical solutions of the embodiment will be described in a clearly and fully understandable way in connection with the drawings related to the embodiments of the invention.

As shown in FIG. 1, a circuit structural diagram of an optical fingerprint identification device is provided, in which the optical fingerprint identification device comprises a plurality of gate lines (e.g., Gate1, Gate2, Gate3 and Gate4), a plurality of read signal lines (e.g., S line1, S line2 and S line3), and a plurality of fingerprint identification units defined by the plurality of gate lines and the plurality of read signal lines intersecting with each other, wherein, each fingerprint identification unit comprises a photosensitive member D1 and a thin film transistor T1; during fingerprint scanning, due to a difference between a valley and a ridge of a fingerprint, a light source radiating on a finger will generate different reflections, so that an intensity of light reaching the photosensitive member D1 changes, generating different photocurrent differences; and under control of the thin film transistor, current differences of respective photosensitive members are sequentially read from the read signal line, so that detection of the valley-ridge of the fingerprint may be implemented.

A First Embodiment

Figure 2:
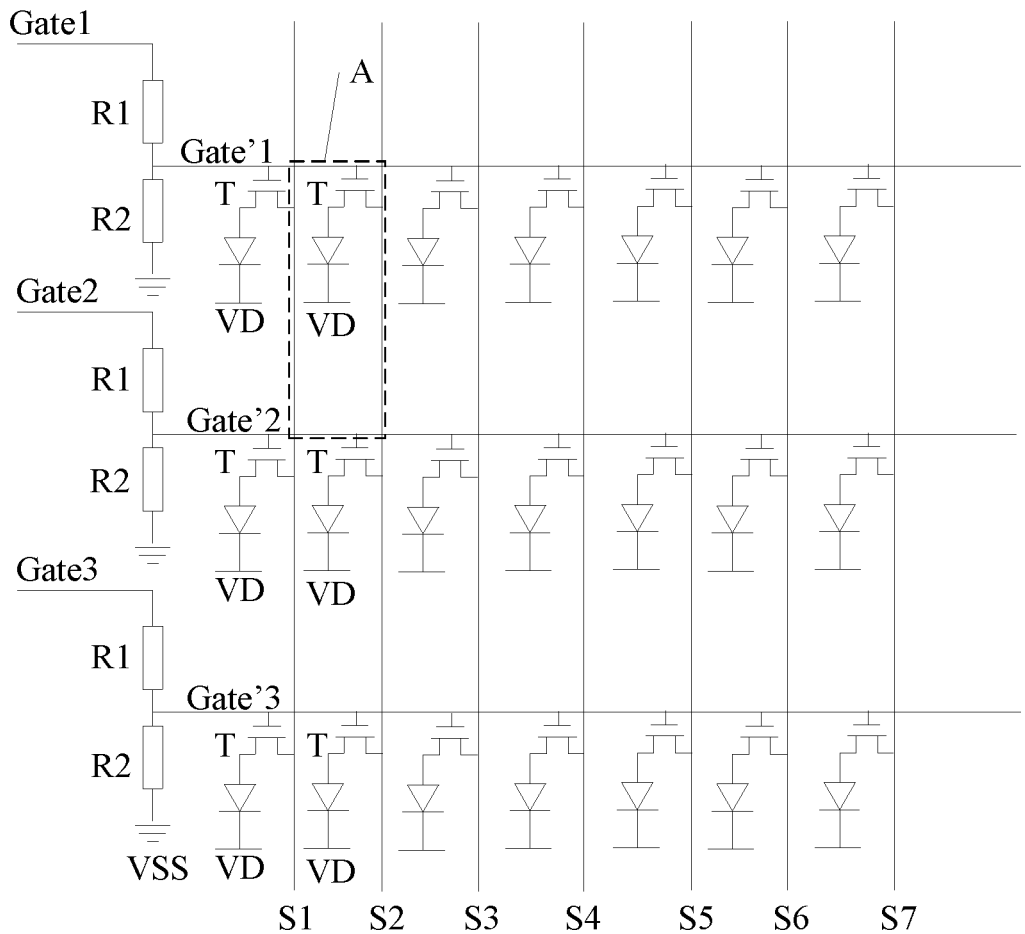
FIG. 2 shows a circuit structural diagram of a fingerprint identification device according to the present disclosure.

With reference to FIG. 2, a circuit structural diagram of a fingerprint identification device according to the present disclosure is shown.

An embodiment of the present disclosure provides a fingerprint identification device, comprising a first gate line, a second gate line, a read signal line and a voltage dividing unit, wherein, a plurality of fingerprint identification units A are defined by the second gate line and the read signal line intersecting with each other, and the fingerprint identification unit A includes a photosensitive member VD and a thin film transistor T;

The first gate line is connected with the voltage dividing unit, the voltage dividing unit includes a pressure sensitive member and an equivalent resistor connected in series, and the second gate line is connected between the pressure sensitive member and the equivalent resistor.

As shown in FIG. 2, the first gate line includes Gate1, Gate2 and Gate3, the second gate line includes Gate'1, Gate'2 and Gate'3, and the read signal line includes S1, S2, S3, S4, S5, S6 and S7. The voltage dividing unit includes a pressure sensitive member and an equivalent resistor connected in series; when R1 is the pressure sensitive member and R2 is the equivalent resistor, a first end of the pressure sensitive member R1 is connected with the first gate line, a second end of the pressure sensitive member R1 is connected with a first end of the equivalent resistor R2, and a second end of the equivalent resistor R2 is connected with a first voltage end VSS; when R1 is the equivalent resistor and R2 is the pressure sensitive member, a first end of the equivalent resistor R1 is connected with the first gate line, a second end of the equivalent resistor R1 is connected with a first end of the pressure sensitive member R2, and a second end of the pressure sensitive member R2 is connected with the first voltage end VSS; and a positional relationship between the pressure sensitive member and the equivalent resistor is related to performances of the pressure sensitive member and the thin film transistor.

Exemplarily, when the pressure sensitive member is not pressed, the thin film transistor is in an OFF state.

With respect to a case where the thin film transistor T is an N-type thin film transistor:

If piezoresistance of the pressure sensitive member becomes smaller as pressure increases, the first gate line is connected with one end of the pressure sensitive member in the voltage dividing unit, and at this time, in FIG. 2, R1 is the pressure sensitive member and R2 is the equivalent resistor; if the piezoresistance of the pressure sensitive member becomes larger as the pressure increases, the first gate line is connected with one end of the equivalent resistor in the voltage dividing unit, and at this time, in FIG. 2, R1 is the equivalent resistor and R2 is the pressure sensitive member.

With respect to a case where the thin film transistor T is a P-type thin film transistor:

If the piezoresistance of the pressure sensitive member becomes smaller as the pressure increases, the first gate line is connected with one end of the equivalent resistor in the voltage dividing unit, and at this time, in FIG. 2, R1 is the equivalent resistor and R2 is the pressure sensitive member; if the piezoresistance of the pressure sensitive member becomes larger as the pressure increases, the first gate line is connected with one end of the pressure sensitive member in the voltage dividing unit, and at this time, in FIG. 2, R1 is the pressure sensitive member and R2 is the equivalent resistor.

Wherein, a gate electrode of the thin film transistor T is connected with the second gate line, a first electrode of the thin film transistor T is connected with the photosensitive member VD, and a second electrode of the thin film transistor T is connected with the read signal line. When the thin film transistor T is an N-type thin film transistor, the first electrode is a drain electrode and the second electrode is a source electrode; and when the thin film transistor T is a P-type thin film transistor, the first electrode is a source electrode and the second electrode is a drain electrode.

A fingerprint identification process according to the present disclosure is illustrated with a first row of gate line; the thin film transistor T is an N-type thin film transistor, R1 is a pressure sensitive member, and R2 is an equivalent resistor. When the finger is pressed on the fingerprint identification device, and light irradiates onto the finger, due to a difference between a valley and a ridge of the fingerprint, a light beam radiating on the finger will generate different reflections, so that an intensity of light reflected onto the photosensitive member VD changes, and the photosensitive member VD converts an optical signal into an electrical signal, thus generating different electrical signals; since the piezoresistance of the pressure sensitive member R1 becomes smaller as the pressure increases, a resistance of the equivalent resistor R2 remains unchanged, a switching signal output from a gate driver on array (GOA) circuit or an integrated circuit (IC) to the first gate line Gate1, is subjected to voltage division by the voltage dividing unit, and then input into the second gate line Gate'1; when the switching signal of the first gate line Gate1 is at high level, as the pressure of finger pressing increases, a voltage input into the second gate line Gate'1 increases, and when the voltage of the second gate line Gate'1 exceeds a critical ON voltage of the thin film transistor T, the thin film transistor T is turned on, so that electrical signals of the respective photosensitive members may be sequentially read from the read signal lines, and a fingerprint signal is detected according to the read electrical signal, so as to implement fingerprint identification. When the switching signal of the first gate line Gate1 is at low level, since the first voltage end VSS connected with the other end of the equivalent resistor R2 is also at low level, the voltage input into the second gate line Gate'1 remains unchanged, and the thin film transistor T remains in an OFF state, wherein, the pressure sensitive member may be a pressure-sensitive sensor, and the photosensitive member may be a photosensitive sensor.

Similarly, in a case where the thin film transistor T is an N-type thin film transistor, R1 is the equivalent resistor, R2 is the pressure sensitive member, and the piezoresistance of the pressure sensitive member R2 becomes larger as the pressure increases, the resistance of the equivalent resistor R1 remains unchanged, when the switching signal of the first gate line Gate1 is at high level, the voltage input into the second gate line Gate'1 also rises as the pressure of finger pressing increases, and when the voltage of the second gate line Gate'1 exceeds the critical ON voltage of the thin film transistor T, the thin film transistor T is turned on, the electrical signals of the respective photosensitive members may be sequentially read from the read signal lines, and the fingerprint signal is detected according to the read electrical signal, so as to implement fingerprint identification; when the switching signal of the first gate line Gate1 is at low level, since the first voltage end VSS connected with the other end of the pressure sensitive member R2 is also at low level, the voltage input into the second gate line Gate'1 remains unchanged, and the thin film transistor T remains in an OFF state.

In the embodiment of the present disclosure, in a case where the thin film transistor is an N-type thin film transistor, when the pressure sensitive member is not pressed, a gate electrode voltage of the thin film transistor T is smaller than the critical ON voltage, and at this time, the thin film transistor T is in an OFF state. Only when the pressure sensitive member is pressed, the gate electrode voltage subjected to voltage division by the voltage dividing unit and then applied to the thin film transistor T gradually increases, so that the thin film transistor T is gradually turned on, so as to implement pressure-triggered fingerprint identification. Thus, even if the switching signal of the first gate line is at high level, when there is no finger pressing, the thin film transistor T is still unable to be turned on, no matter how intensive ambient light is; and since the thin film transistor T is in an OFF state, detection of the fingerprint signal will not be affected. Therefore, interference of stray light in the environment may be resisted, and there is no stray light in the obtained fingerprint signal, which reduces difficulty in fingerprint identification.

Wherein, when the pressure sensitive member is not pressed, the gate electrode voltage of the thin film transistor T may be set close to the critical ON voltage, and when there is finger pressing, the thin film transistor T may be directly turned on, and a corresponding electrical signal may be directly read from the read signal line and transmitted to a fingerprint signal detection system for detection, so as to implement fingerprint identification.

Similarly, in a case where the thin film transistor is a P-type thin film transistor, when the pressure sensitive member is not pressed, the gate electrode voltage of the thin film transistor is larger than the critical ON voltage, and at this time, the thin film transistor T is in an OFF state.

Wherein, when R1 is the pressure sensitive member, R2 is the equivalent resistor, and the piezoresistance of the pressure sensitive member R1 becomes larger as the pressure increases, the resistance of the equivalent resistor R2 remains unchanged, the voltage input into the second gate line Gate'1 decreases as the pressure of the finger pressing increases, and when the voltage of the second gate line Gate'1 is smaller than the critical ON voltage of the thin film transistor T, the thin film transistor T is turned on, so as to implement pressure-triggered fingerprint identification.

When R1 is the equivalent resistor, R2 is the pressure sensitive member, and the piezoresistance of the pressure sensitive member R2 becomes smaller as the pressure increases, the resistance of the equivalent resistor R1 remains unchanged, the voltage input into the second gate line Gate'1 also decreases as the pressure of finger pressing increases, and when the voltage of the second gate line Gate'1 is smaller than the critical ON voltage of the thin film transistor T, the thin film transistor T is turned on, so as to implement pressure-triggered fingerprint identification.

It should be noted that, the second gate line may be continuous in a whole row, or may be disconnected. When the second gate line is a whole row of continuous gate line, the pressure sensitive member is used for controlling a thin film transistor connected with the second gate line; and when the second gate line includes a plurality of gate lines independent of one another, the pressure sensitive member is used for correspondingly controlling a thin film transistor connected with a segment of second gate line.

When the second gate line is a whole row of continuous gate line, the pressure sensitive member in FIG. 2 is a plurality of pressure sensitive members connected in series, but not just a single pressure sensitive member.

Figure 3:
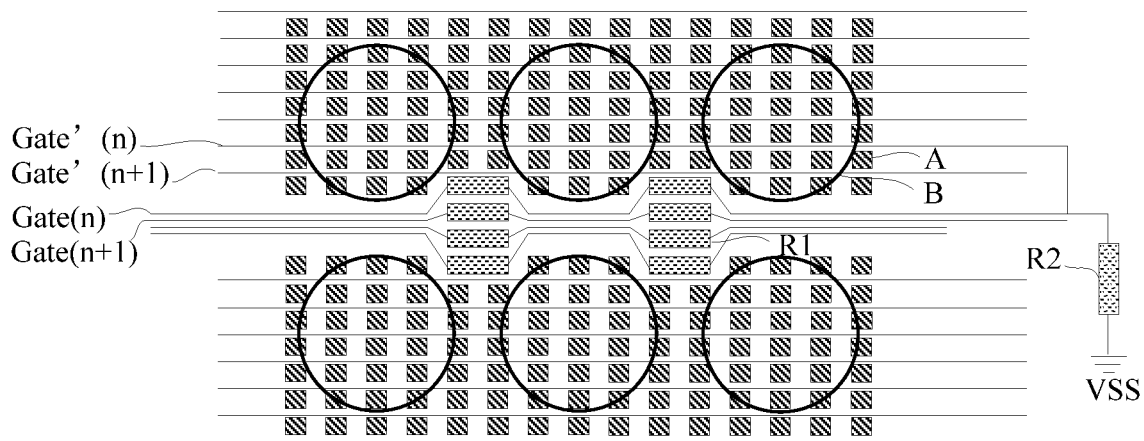
FIG. 3 shows a structural schematic diagram of the fingerprint identification device according to the present disclosure.

With reference to FIG. 3, a structural schematic diagram of a fingerprint identification device according to the present disclosure is shown.

In one embodiment of the present disclosure, Gate(n) and Gate(n+1) are first gate lines, Gate'(n) and Gate'(n+1) are second gate lines, the second gate lines Gate' (n) and Gate'(n+1) are whole rows of continuous gate line; R1 is a pressure sensitive member, R2 is an equivalent resistor, the equivalent resistor R2 is connected with the first voltage end VSS, a voltage of the first voltage end VSS is a fixed voltage, and may be set to a ground voltage or a negative voltage, the voltage of the first voltage end VSS may be specifically set according to actual conditions; A is a fingerprint identification unit, the fingerprint identification unit A includes a photosensitive member and a thin film transistor; B is an effective fingerprint identification region, only the fingerprint identification unit A located in the effective fingerprint identification region B may detect an effective fingerprint signal, and detection performed by remaining fingerprint identification units outside the effective fingerprint identification region B on the fingerprint signal has no practical significance.

A switching signal generated from a GOA circuit or an IC passes through the first gate line Gate(n), but is not directly applied to a gate electrode of the thin film transistor connected with the second gate line Gate' (n); actually, the first gate line Gate(n) is connected with a plurality of pressure sensitive members R1 and an equivalent resistor R2 connected in series, and the switching signal output by the first gate line Gate(n), after voltage division by the plurality of pressure sensitive members R1 and an equivalent resistor R2 connected in series, is input into the gate electrode of the thin film transistor connected with the second gate line Gate'(n), controlling an ON-OFF state of the thin film transistor, so as to implement fingerprint identification.

It should be noted that, the pressure sensitive member in FIG. 3 is a plurality of pressure sensitive members connected in series, which thus, may ensure that, during fingerprint identification, pressure sensitive members corresponding to a finger pressing region may sense a pressure change so long as the finger presses the fingerprint identification device, to further control turning on of the thin film transistor, and that no such a case occurs where turning on of the thin film transistor is unable to be controlled when there is finger pressing, so as to avoid generating a pressure blind region.

As may be seen from FIG. 3, the pressure sensitive member is generally provided outside the effective fingerprint identification region B, so as not to affect a structure and a performance of the fingerprint identification unit, or add extra space; and an arrangement structure of the fingerprint identification unit and the pressure sensitive member has not any wiring being led out, and may all be provided inside the fingerprint identification device, which may not only facilitate design of wiring inside the fingerprint identification device, but also facilitate subsequent circuit detection.

Since the pressure sensitive member is added outside the effective fingerprint identification region B, the fingerprint identification device is pressed by the finger, and the pressure sensitive member controls a turning-on degree of the thin film transistor according to a magnitude of a pressure of finger pressing, to further obtain different fingerprint signal amounts. Generally, before fingerprint identification is performed, a piece of fingerprint picture information is pre-stored, the pre-stored fingerprint picture information includes a reference signal amount, and the obtained fingerprint signal amount is compared with the reference signal amount, to obtain the magnitude of the pressure of finger pressing. Under the premise of not reducing detection accuracy of the fingerprint signal, pressure information of finger pressing may be obtained without adding any additional detection circuit; the pressure information may be used as auxiliary information for safety identification, and the pressure information may be used for obtaining richer user control experience, for example, different application (APP) operations may be triggered according to the magnitude of the pressure of finger pressing.

Figure 4:
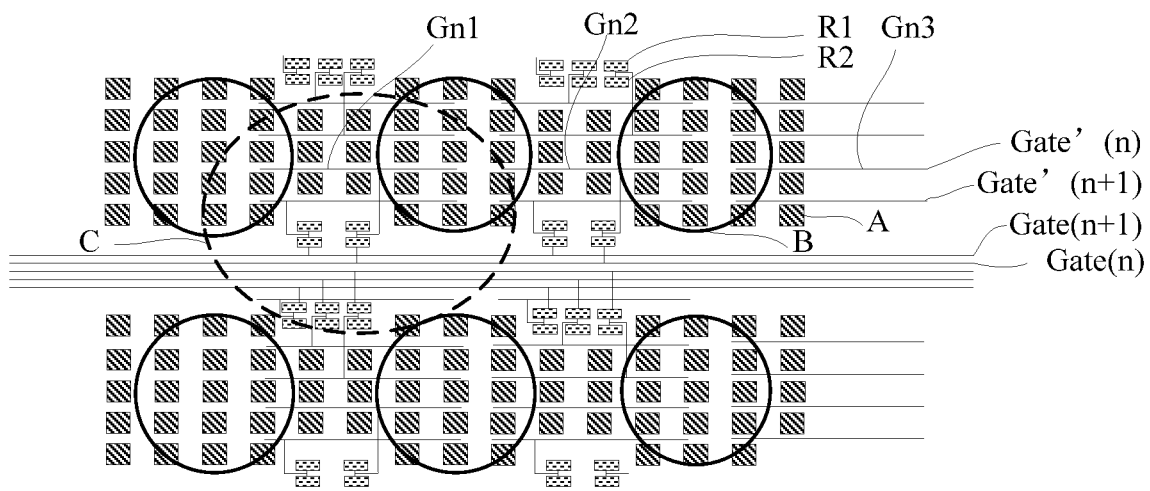
FIG. 4 shows a structural schematic diagram of another fingerprint identification device according to the present disclosure.

With reference to FIG. 4, a structural schematic diagram of another fingerprint identification device according to the present disclosure is shown.

In another embodiment of the present disclosure, Gate(n) and Gate(n+1) are first gate lines, Gate'(n) and Gate'(n+1) are second gate lines, the second gate line Gate'(n) includes a plurality of gate lines independent of one another, for example, a gate line Gn1, a gate line Gn2 and a gate line Gn3 are independent of and disconnected from one another, there is no connection between the gate line Gn1 and the gate line Gn2, and there is no connection between the gate line Gn2 and the gate line Gn3; the second gate line Gate'(n+1) also includes a plurality of gate lines independent of one another. R1 is a pressure sensitive member and R2 is an equivalent resistor; or R1 is an equivalent resistor and R2 is a pressure sensitive member. A is a fingerprint identification unit, the fingerprint identification unit A includes a photosensitive member and a thin film transistor; and B is an effective fingerprint identification region.

A switching signal generated from a GOA circuit or an IC passes through the first gate line Gate(n), but is not directly applied to a gate electrode of the thin film transistor connected with the second gate line Gate'(n); actually, the first gate line Gate(n) is connected with a pressure sensitive member and an equivalent resistor, and the switching signal output by the first gate line Gate(n), after voltage division by the pressure sensitive member and the equivalent resistor, is input into the gate electrode of the thin film transistor connected with the second gate line Gate' (n). Correspondingly, when a position of finger pressing is region C, a corresponding second gate line is Gn1, then the switching signal output by the first gate line Gate(n), after voltage division by the pressure sensitive member and the equivalent resistor, is input into the gate electrode of the thin film transistor connected with the second gate line Gn1, controlling an ON-OFF state of the thin film transistor in a region where the region C and the effective fingerprint identification region B intersect with each other, so as to implement fingerprint identification.

In the fingerprint identification device according to the embodiment of the present disclosure, the pressure sensitive member only correspondingly controls the thin film transistor connected with a segment of second gate line, and a corresponding fingerprint signal may be detected only in a small region corresponding to the pressing.

Figure 5:
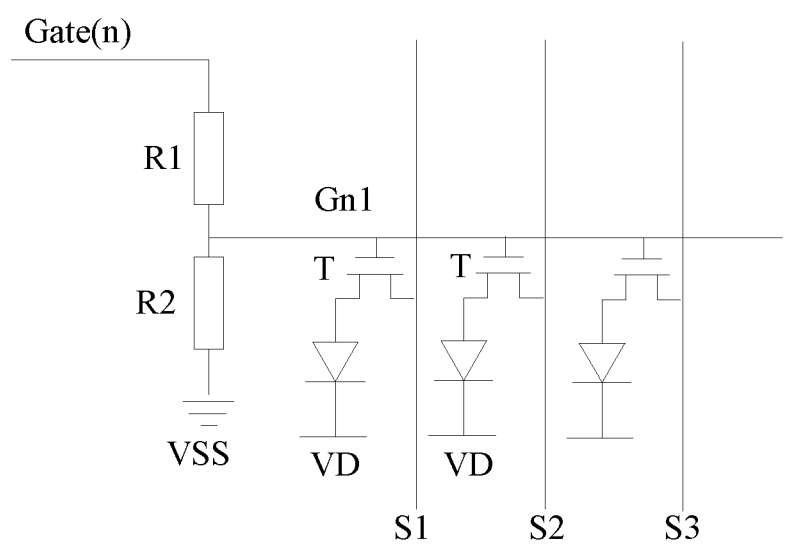
FIG. 5 shows a partial circuit structural diagram of region C in FIG. 4.

With reference to FIG. 5, a local circuit principle structural diagram of the region C in FIG. 4 is shown.

FIG. 5 is a partial circuit principle structural diagram of the region C in FIG. 4, the first gate line is Gate(n), the second gate line is a segment of gate line Gn1 in Gate'(n), the fingerprint identification unit includes a photosensitive member VD and a thin film transistor T, S1, S2 and S3 are read signal lines, VSS is a first voltage end, R1 is a pressure sensitive member and R2 is an equivalent resistor; or R1 is an equivalent resistor and R2 is a pressure sensitive member. The switching signal output by the first gate line Gate(n), after voltage division by the pressure sensitive member and the equivalent resistor, is input into the gate electrode of the thin film transistor connected with the second gate line Gn1; since detection performed by remaining fingerprint identification units outside the effective fingerprint identification region B on the fingerprint signal has no practical significance, the ON-OFF state of the thin film transistor only in a region where region C and the effective fingerprint identification region B intersect with each other is controlled; as may be seen from FIG. 4, in the controlled region where region C and the effective fingerprint identification region B intersect with each other, there are only three effective fingerprint identification units connected with the second gate line Gn1, and correspondingly in FIG. 5, there are also only three effective fingerprint identification units connected with the second gate line Gn1.

Figure 6:
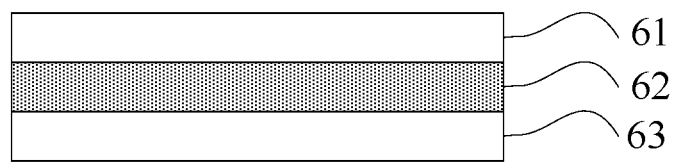
FIG. 6 shows a structural schematic diagram of a pressure sensitive member according to the present disclosure.

With reference to FIG. 6, a structural schematic diagram of the pressure sensitive member according to the present disclosure is shown.

In the embodiment of the present disclosure, the pressure sensitive member includes an upper electrode layer 61, a pressure sensitive material 62 and a lower electrode layer 63 arranged in a stacked manner, wherein, the upper electrode layer is shared with a first electrode layer of the photosensitive member, and the lower electrode layer is shared with a second electrode layer of the photosensitive member.

It should be noted that, when the upper electrode layer of the pressure sensitive member is shared with the first electrode layer of the photosensitive member, and the lower electrode layer of the pressure sensitive member is shared with the second electrode layer of the photosensitive member, in order to prevent mutual interference between the pressure sensitive member and the photosensitive member, it is necessary to use a time-sharing mode, for example, in a pressure sensing phase, the photosensitive member is controlled to be in a non-operating state, and in a fingerprint identification phase, the pressure sensitive member is controlled to be in a non-operating state.

Of course, the upper electrode layer of the pressure sensitive member may not be shared with the first electrode layer of the photosensitive member, the lower electrode layer of the pressure sensitive member may not be shared with the second electrode layer of the photosensitive member; and the upper electrode layer and the lower electrode layer of the pressure sensitive member are fabricated separately.

Wherein, the pressure sensitive material is polyvinylidene fluoride or a quantum channel synthetic material. When the pressure sensitive material is polyvinylidene fluoride, piezoresistance of a corresponding pressure sensitive member becomes larger as pressure increases; when the pressure sensitive material is a quantum channel synthetic material, piezoresistance of a corresponding pressure sensitive member becomes smaller as pressure increases.

In the embodiment of the present disclosure, the fingerprint identification device comprises a first gate line, a second gate line, a read signal line and a voltage dividing unit, wherein, the plurality of fingerprint identification units are defined by the second gate line and the read signal line intersecting with each other, and the fingerprint identification unit includes a photosensitive member and a thin film transistor; the first gate line is connected with the voltage dividing unit, the voltage dividing unit includes a pressure sensitive member and an equivalent resistor connected in series, and the second gate line is connected between the pressure sensitive member and the equivalent resistor. The pressure sensitive member and the equivalent resistor are connected in series to form the voltage dividing unit, so that a switching signal which originally controls the fingerprint identification unit is subjected to voltage division by the voltage dividing unit and then is applied to the gate electrode of the thin film transistor, to change the ON-OFF state of the thin film transistor with a change in a finger pressure; the thin film transistor is turned on to generate the fingerprint signal only when there is finger pressing; and when there is no finger pressing, the thin film transistor remains in an OFF state no matter how intensive ambient light is, which will not affect detection of the fingerprint signal, may resist interference of stray light in the environment, and reduce difficulty in fingerprint identification; and at a same time, pressure information of the finger may be obtained, which may be used as auxiliary information for safety identification, to achieve richer user experience.

A Second Embodiment

The second embodiment of the present disclosure provides an array substrate, comprising the above-described fingerprint identification device, the fingerprint identification device comprising a first gate line, a second gate line, a read signal line and a voltage dividing unit, wherein, a plurality of fingerprint identification units are defined by the second gate line and the read signal line intersecting with each other, and the fingerprint identification unit includes a photosensitive member and a thin film transistor; the first gate line is connected with the voltage dividing unit, the voltage dividing unit includes a pressure sensitive member and an equivalent resistor connected in series, and the second gate line is connected between the pressure sensitive member and the equivalent resistor.

Wherein, in a case where the thin film transistor is an N-type thin film transistor, when the pressure sensitive member is not pressed, a gate electrode voltage of the thin film transistor is smaller than a critical ON voltage. In a case where the thin film transistor is a P-type thin film transistor, when the pressure sensitive member is not pressed, the gate electrode voltage of the thin film transistor is larger than the critical ON voltage.

In an embodiment of the present disclosure, the second gate line is a whole row of continuous gate line, and the pressure sensitive member is used for controlling the thin film transistor connected with the second gate line.

In another embodiment of the present disclosure, the second gate line includes a plurality of gate lines independent of one another, and the pressure sensitive member is used for correspondingly controlling a thin film transistor connected with a segment of second gate line.

The pressure sensitive member includes an upper electrode layer, a pressure sensitive material and a lower electrode layer arranged in a stacked manner, wherein, the upper electrode layer is shared with a first electrode layer of the photosensitive member, and the lower electrode layer is shared with a second electrode layer of the photosensitive member. The pressure sensitive material is polyvinylidene fluoride or a quantum channel synthetic material.

With respect to the N-type thin film transistor, if piezoresistance of the pressure sensitive member becomes smaller as pressure increases, the first gate line is connected with one end of the pressure sensitive member in the voltage dividing unit. If the piezoresistance of the pressure sensitive member becomes larger as the pressure increases, the first gate line is connected with one end of the equivalent resistor in the voltage dividing unit.

With respect to the P-type thin film transistor, if the piezoresistance of the pressure sensitive member becomes smaller as the pressure increases, the first gate line is connected with one end of the equivalent resistor in the voltage dividing unit. If the piezoresistance of the pressure sensitive member becomes larger as the pressure increases, the first gate line is connected with one end of the pressure sensitive member in the voltage dividing unit.

Wherein, the gate electrode of the thin film transistor is connected with the second gate line, a first electrode of the thin film transistor is connected with the photosensitive member, and a second electrode of the thin film transistor is connected with the read signal line.

In the embodiment of the present disclosure, the array substrate comprises the fingerprint identification device, and the fingerprint identification device comprises the first gate line, the second gate line, the read signal line and the voltage dividing unit, wherein, the plurality of fingerprint identification units are defined by the second gate line and the read signal line intersecting with each other, and the fingerprint identification unit includes the photosensitive member and the thin film transistor; the first gate line is connected with the voltage dividing unit, the voltage dividing unit includes the pressure sensitive member and the equivalent resistor connected in series, and the second gate line is connected between the pressure sensitive member and the equivalent resistor. The pressure sensitive member and the equivalent resistor are connected in series to form the voltage dividing unit, so that the switching signal which originally controls the fingerprint identification unit is subjected to voltage division by the voltage dividing unit and then is applied to the gate electrode of the thin film transistor, to change the ON-OFF state of the thin film transistor with a change in a finger pressure; the thin film transistor is turned on to generate the fingerprint signal only when there is finger pressing; and when there is no finger pressing, the thin film transistor remains in an OFF state no matter how intensive ambient light is, which will not affect detection of the fingerprint signal, may resist interference of stray light in the environment, and reduce a difficulty in fingerprint identification; and at a same time, pressure information of the finger may be obtained, which may be used as auxiliary information for safety identification, to achieve richer user experience.

A Third Embodiment

The third embodiment of the present disclosure further provides a display device, comprising a light-emitting unit, a light guide plate, a small orifice plate and the above-described array substrate.

Figure 7:
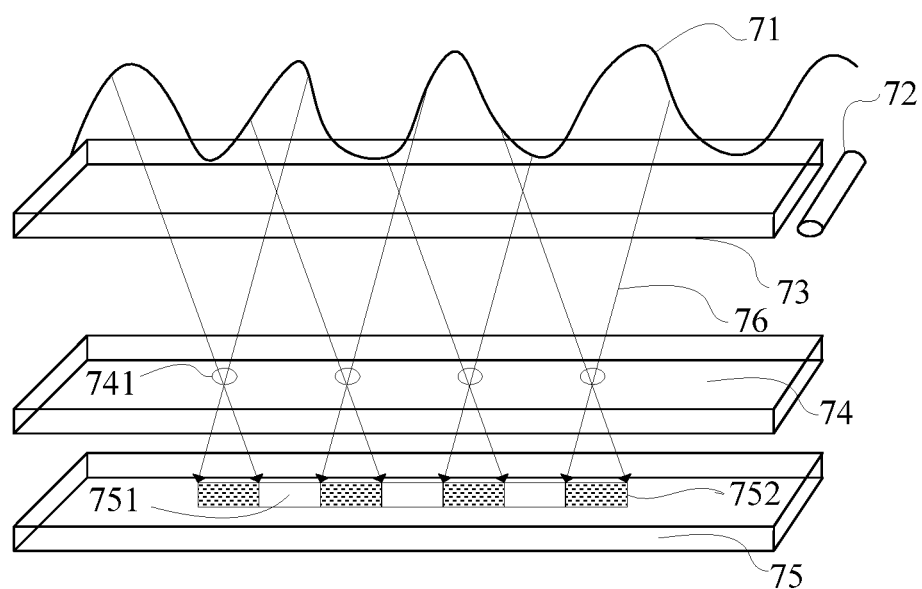
FIG. 7 shows a structural schematic diagram of a display device according to the present disclosure.

With reference to FIG. 7, a structural schematic diagram of the display device according to the present disclosure is shown.

Wherein, 71 is a fingerprint of a finger, 72 is the light-emitting unit, 73 is the light guide plate, 74 is the small orifice plate, 75 is the array substrate, a plurality of small orifices 741 are distributed on the small orifice plate 74, a fingerprint identification device is provided on the array substrate 75, and the fingerprint identification device comprises a pressure sensitive member 751 and a photosensitive member 752.

It should be noted that, the fingerprint identification device further comprises an equivalent resistor and a thin film transistor (not shown); the photosensitive member 752 in FIG. 7 is not one photosensitive member, but an array of photosensitive members, and of course, the pressure sensitive member 751 is also an array of pressure sensitive members; the small orifice 741 in the small orifice plate 74 may transmit light, and a remaining portion is unable to transmit light; the light-emitting unit may be located on a right side of the light guide plate, and may also be located on a left side of the light guide plate, which will not be limited in the embodiments of the present disclosure.

Light emitted by the light-emitting unit 72 enters in the light guide plate 73 and is reflected inside the light guide plate 73; when the finger presses over the light guide plate 73, the fingerprint 71 destroys total reflection inside the light guide plate 73, so that a light beam irradiating on the finger 71 generates different reflections, reflected light 76 irradiates onto the photosensitive member 752 through the small orifice 741 on the small orifice plate 74; the photosensitive member 752 converts an optical signal into an electrical signal, and then turning on of the thin film transistor is controlled by the pressure sensitive member 751, electrical signals of respective photosensitive members are further sequentially read from the read signal line, and a fingerprint signal is detected according to the read electrical signal, so as to implement fingerprint identification.

Exemplarily, the light-emitting unit may be used for display and fingerprint identification at a same time, or a light-emitting unit may be separately provided for fingerprint identification, and a light-emitting unit is separately provided for display, which will not be limited in the embodiments of the present disclosure.

In the embodiment of the present disclosure, a principle of small orifice imaging is used for restoring a long-distance fingerprint signal onto the photosensitive member with high precision, so as to implement long-distance high-precision fingerprint identification.

Wherein, a distance from the light guide plate 73 to the small orifice plate 74 is larger than a distance from the small orifice plate 74 to the array substrate 75, so that the photosensitive member may acquire all fingerprint information on the finger, to ensure integrity of the fingerprint information.

Due to the principle of small orifice imaging, light passing through the small orifice will produce a gap between photosensitive member arrays; and even if there is a photosensitive member provided at the gap, the photosensitive member at the gap has no effect on fingerprint identification, so a pressure sensitive member may be provided at the gap. That is to say, the pressure sensitive member 751 is located outside an effective fingerprint identification region; the effective fingerprint identification region is an image region generated on the array substrate after the fingerprint optical signal passes through the small orifice on the small orifice plate.

The display device may be: a mobile phone, a tablet personal computer, a television, a monitor, a laptop, a navigator, and any other product or component having a fingerprint identification function and a display function.

In the embodiment of the present disclosure, the display device comprises the array substrate, the array substrate comprises the fingerprint identification device, and the fingerprint identification device comprises the first gate line, the second gate line, the read signal line and the voltage dividing unit, wherein, the plurality of fingerprint identification units are defined by the second gate line and the read signal line intersecting with each other, and the fingerprint identification unit includes the photosensitive member and the thin film transistor; the first gate line is connected with the voltage dividing unit, the voltage dividing unit includes the pressure sensitive member and the equivalent resistor connected in series, and the second gate line is connected between the pressure sensitive member and the equivalent resistor. The pressure sensitive member and the equivalent resistor are connected in series to form the voltage dividing unit, so that the switching signal which originally controls the fingerprint identification unit is subjected to voltage division by the voltage dividing unit and then is applied to the gate electrode of the thin film transistor, to change the ON-OFF state of the thin film transistor with a change in a finger pressure; the thin film transistor is turned on to generate the fingerprint signal only when there is finger pressing; and when there is no finger pressing, the thin film transistor remains in an OFF state no matter how intensive ambient light is, which will not affect detection of the fingerprint signal, may resist interference of stray light in the environment, and reduce difficulty in fingerprint identification; and at a same time, pressure information of the finger may be obtained, which may be used as auxiliary information for safety identification, to achieve richer user experience.

In addition, the present disclosure further provides a fingerprint identification method, in which the above-described fingerprint identification device is used, comprising: acquiring, by the read signal line, a fingerprint signal of a finger, when the pressure sensitive member is pressed by the finger, to perform fingerprint identification.

Exemplarily, the fingerprint identification method further comprises: obtaining different fingerprint signal amounts according to a turning on degree of the thin film transistor, when the pressure sensitive member is pressed, comparing the fingerprint signal amount with a reference signal amount, to obtain information of a pressing pressure; and triggering different applications according to the information of the pressing pressure.

Exemplarily, the fingerprint identification method further comprises: obtaining the reference signal amount, wherein, the reference signal amount is obtained from pre-stored fingerprint picture information.

The detailed description may refer to the foregoing description, which will not is given here.

The embodiments of the present disclosure are described in a progressive manner, and in each embodiment, the difference with other embodiments is especially explained, and the same or similar portion of the embodiments may mutually refer.

In the present disclosure, the terms, such as "first," "second," or the like, which are used in the description and the claims of the present disclosure, are not intended to indicate any sequence or relationship between the components or operations, but for distinguishing one component or operation with the other component or operation. The terms, such as "comprise/comprising," "include/including," or the like are intended to specify that the elements or the objects stated before these terms encompass the elements or the objects and equivalents thereof listed after these terms, but not preclude other elements or objects. Without more limitation, the element defined by the term "comprising a" is not intended to preclude other same element in a process, a method, a product and a device comprising the elements.

The fingerprint identification device, an array substrate, a display device and a fingerprint identification method of the present disclosure are described in details above, the principle and the embodiment of the present disclosure are explained by using an example, the above description of the embodiment is only used for helping understanding of the method of the core principle of the present disclosure; meanwhile, for those skilled in the art, any modification and equivalent replacement may be made by those skilled in the art within the substantial protection scope of the embodiments of the present disclosure, which is regarded as falling within the protection scope of embodiments of the present disclosure. The present disclosure is not limitative to the scope of the disclosure.

The present application claims priority of Chinese Patent Application No. 201710680606.8 filed on Aug. 10, 2017, the disclosure of which is incorporated herein by reference in its entirety as part of the present application.

The invention claimed is:

1. A fingerprint identification device, comprising:
    a first gate line, a second gate line, a read signal line and a voltage dividing unit,
    wherein, a plurality of fingerprint identification units are defined by the second gate line and the read signal line intersecting with each other, and the fingerprint identification unit includes a photosensitive member and a thin film transistor;
    the first gate line is connected with the voltage dividing unit, the voltage dividing unit includes a pressure sensitive member and an equivalent resistor connected in series, and the second gate line is connected between the pressure sensitive member and the equivalent resistor.

2. The fingerprint identification device according to claim 1, wherein, under a condition that the pressure sensitive member is not pressed, the thin film transistor is in an OFF state.

3. The fingerprint identification device according to claim 2, wherein, one end of the voltage dividing unit is connected with the first gate line, and the other end of the voltage dividing unit is grounded.

4. The fingerprint identification device according to claim 2, wherein, in a case where the thin film transistor is an N-type thin film transistor, when the pressure sensitive member is not pressed, a gate electrode voltage of the thin film transistor is smaller than a critical ON voltage.

5. The fingerprint identification device according to claim 2, wherein, in a case where the thin film transistor is a P-type thin film transistor, when the pressure sensitive member is not pressed, a gate electrode voltage of the thin film transistor is larger than a critical ON voltage.

6. The fingerprint identification device according to claim 2, wherein, the second gate line is a whole row of continuous gate line, and the pressure sensitive member is used for controlling the thin film transistor connected with the second gate line.

7. The fingerprint identification device according to claim 2, wherein, the second gate line includes a plurality of gate lines independent of one another, and the pressure sensitive member is used for correspondingly controlling a thin film transistor connected with a segment of second gate line.

8. The fingerprint identification device according to claim 2, wherein, the pressure sensitive member includes an upper electrode layer, a pressure sensitive material and a lower electrode layer arranged in a stacked manner, the upper electrode layer is shared with a first electrode layer of the photosensitive member, and the lower electrode layer is shared with a second electrode layer of the photosensitive member.

9. The fingerprint identification device according to claim 8, wherein, the pressure sensitive material is polyvinylidene fluoride or a quantum channel synthetic material.

10. The fingerprint identification device according to claim 3, wherein, under a condition that piezoresistance of the pressure sensitive member becomes smaller as pressure increases, the first gate line is connected with one end of the pressure sensitive member in the voltage dividing unit.

11. The fingerprint identification device according to claim 3, wherein, under a condition that piezoresistance of the pressure sensitive member becomes larger as pressure increases, the first gate line is connected with one end of the equivalent resistor in the voltage dividing unit.

12. The fingerprint identification device according to claim 4, wherein, under a condition that piezoresistance of the pressure sensitive member becomes smaller as pressure increases, the first gate line is connected with one end of the pressure sensitive member in the voltage dividing unit; and under a condition that the piezoresistance of the pressure sensitive member becomes smaller as the pressure increases, the first gate line is connected with one end of the equivalent resistor in the voltage dividing unit.

13. The fingerprint identification device according to claim 1, wherein, a gate electrode of the thin film transistor is connected with the second gate line, a first electrode of the thin film transistor is connected with the photosensitive member, and a second electrode of the thin film transistor is connected with the read signal line.

14. An array substrate, comprising the fingerprint identification device according to claim 1.

15. A display device, comprising a light-emitting unit, a light guide plate, a small orifice plate and the array substrate according to claim 14, wherein, the small orifice plate is located between the light guide plate and the array substrate.

16. The display device according to claim 15, wherein, the pressure sensitive member is located outside an effective fingerprint identification region; and the effective fingerprint identification region is an image region generated on the array substrate after the fingerprint optical signal passes through a small orifice on the small orifice plate.

17. The display device according to claim 16, wherein, a distance from the light guide plate to the small orifice plate is larger than a distance from the small orifice plate to the array substrate.

18. A fingerprint identification method, in which the fingerprint identification device according to claim 1 is used, comprising:
  acquiring, by the read signal line, a fingerprint signal of a finger, when the pressure sensitive member is pressed by the finger, to perform fingerprint identification.

19. The fingerprint identification method according to claim 18, further comprising:
  obtaining different fingerprint signal amounts according to a turning on degree of the thin film transistor, when the pressure sensitive member is pressed,
  comparing the fingerprint signal amount with a reference signal amount, to obtain information of a pressing pressure; and
  triggering different applications according to the information of the pressing pressure.

20. The fingerprint identification method according to claim 18, further comprising:
  obtaining the reference signal amount,
  wherein, the reference signal amount is obtained from pre-stored fingerprint picture information.

* * * * *